United States Patent
Natarajan

(10) Patent No.: US 9,547,038 B2
(45) Date of Patent: Jan. 17, 2017

(54) LOW-OVERHEAD DEBUG ARCHITECTURE USING A SPECULATIVE, CONCURRENT AND DISTRIBUTED DATA CAPTURE AND PROPAGATION SCHEME

(71) Applicant: Samsung Electronics Co., Ltd., Suwon-si, Gyeonggi-do (KR)

(72) Inventor: Rohit Natarajan, Sunnyvale, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 55 days.

(21) Appl. No.: 14/714,283

(22) Filed: May 16, 2015

(65) Prior Publication Data

US 2016/0202320 A1    Jul. 14, 2016

Related U.S. Application Data

(60) Provisional application No. 62/101,959, filed on Jan. 9, 2015.

(51) Int. Cl.
*G01R 31/317* (2006.01)
*G06F 11/34* (2006.01)

(52) U.S. Cl.
CPC ... *G01R 31/31704* (2013.01); *G01R 31/31705* (2013.01); *G06F 11/348* (2013.01); *G06F 11/3466* (2013.01); *G06F 11/3476* (2013.01)

(58) Field of Classification Search
CPC ... G06F 11/3466; G06F 11/347; G06F 11/348; G06F 11/3471; G01R 31/31705; G01R 31/31704
See application file for complete search history.

(56) References Cited

U.S. PATENT DOCUMENTS

| | | | | |
|---|---|---|---|---|
| 6,243,836 B1* | 6/2001 | Whalen | ............ | G06F 11/25 714/39 |
| 6,507,921 B1* | 1/2003 | Buser | ............ | G06F 5/01 712/E9.019 |
| 6,618,775 B1* | 9/2003 | Davis | ............ | G06F 11/3466 710/100 |
| 6,732,307 B1* | 5/2004 | Edwards | ............ | G06F 11/3636 714/45 |
| 6,918,065 B1* | 7/2005 | Edwards | ............ | G06F 11/348 341/76 |
| 7,080,283 B1* | 7/2006 | Songer | ............ | G06F 11/3636 714/30 |

(Continued)

*Primary Examiner* — Yolanda L Wilson
(74) *Attorney, Agent, or Firm* — Renaissance IP Law Group LLP

(57) ABSTRACT

A system and corresponding method captures speculative and concurrent trace-data and trace-clock information from core processing units of a System on a Chip (SOC). An interface receives trace data from at least one core processing unit, and a storage array stores the trace data in two different modes of operation. In the first mode, which occurs prior to a predetermined operating state of the SOC, the storage array operates in a circular buffer mode in which the newest trace data overwrites the oldest trace data when the storage array becomes full In the second mode, which occurs after the predetermined operating state of the SOC, the storage array operates in a FIFO mode in which the newest trace data is written into the storage array and the oldest trace data contained in the storage array is output to a debug processing core unit of the SOC.

20 Claims, 5 Drawing Sheets

(56) References Cited

U.S. PATENT DOCUMENTS

| | | | |
|---|---|---|---|
| 2010/0332909 A1* | 12/2010 | Larson | G06F 11/3476 714/40 |
| 2012/0216080 A1* | 8/2012 | Bansal | G06F 11/3476 714/45 |
| 2012/0226839 A1* | 9/2012 | Fuoco | G06F 11/3636 710/110 |
| 2014/0013145 A1 | 1/2014 | Hopkins | |
| 2014/0052930 A1 | 2/2014 | Gulati et al. | |
| 2014/0095846 A1 | 4/2014 | Mayer | |
| 2014/0189437 A1* | 7/2014 | Mayer | G06F 11/3495 714/45 |
| 2015/0127994 A1* | 5/2015 | Sankar | G06F 11/3636 714/45 |

\* cited by examiner

FIG. 4

LOW-OVERHEAD DEBUG ARCHITECTURE USING A SPECULATIVE, CONCURRENT AND DISTRIBUTED DATA CAPTURE AND PROPAGATION SCHEME

CROSS-REFERENCE TO RELATED APPLICATION

This application claims priority under 35 U.S.C. §120 to U.S. Provisional Patent Application Ser. No. 62/101,959, filed on Jan. 9, 2015, the contents of which are incorporated by reference in their entirety herein.

BACKGROUND

Systems on Chip (SOCs) typically integrate a large and diverse number of components, or core processing units, that have different performance, power, interface and connectivity characteristics. Accordingly, SOC implementations manage the complexity of multiple (and independent) clock domains, power domains and inter-component routing. Components that were previously discrete and accessible because they were part of a printed circuit board (PCB) are now "buried" deep within an SOC and are not accessible to debugging tools, such as oscilloscopes, logic analyzers and data recorders.

Debug and Power/Performance profiling of an SOC is extremely challenging as visibility into the functionality and interaction of different core processing units of an SOC is limited. Design for Debug (DFD) features are utilized to access key functionalities of core processing units of an SOC, such as internal micro-architectural states, Finite State Machine (FSM) states, low-power controls, queue status, etc. DFD features can, however, add significant complexity in routing and timing closure, area and/or performance penalty in order to instrument the design, and transport and observe debug information of an SOC.

SUMMARY

Exemplary embodiments provide a system and a method that captures speculative and concurrent trace-data and trace-clock information from core processing units of SOC.

One exemplary embodiment provides a system on a chip (SOC) that comprises at least one core processing unit and a debug unit that corresponds to at least core processing unit. The debug unit comprises an interface, an event detector and a storage array. The interface is configured to receive trace data from the corresponding core processing unit. The event detector is configured to detect a predetermined operating state of the core processing unit. The storage array is configured to receive the trace data from the interface in both a first mode of operation and in a second mode of operation. The first mode of operation occurs prior to the event detector detecting the predetermined operating state. In the first mode of operation, the storage array is configured to operate in a circular buffer mode in which a newest trace data overwrites an oldest trace data contained in the storage array when the storage array becomes full. The second mode of operation occurs after the event detector detects the predetermined operating state. In the second mode of operation, the storage array is configured to operate in a first in, first out (FIFO) mode in which the newest trace data is written into the storage array and the oldest trace data contained in the storage array is output to a debug processing unit of the SOC. In one exemplary embodiment, the second mode of operation further comprises a condition of interest being detected at a core processing unit from which the interface is not configured to receive trace data.

In one exemplary embodiment, the interface is further configured to receive trace clock data from the corresponding core processing unit, and the memory array is further configured to receive the trace clock data. In the first mode of operation, the storage array is further configured to operate in the circular buffer mode in which the newest trace data and a newest trace clock data overwrites the oldest trace data and an oldest trace clock data contained in the storage array when the storage array becomes full. In the second mode of operation, the storage array is further configured to operate in the FIFO mode in which the newest trace data and the newest trace clock data is written into the storage array and the oldest trace data and the oldest trace clock data contained in the storage array is output to the debug processing unit of the SOC.

In one exemplary embodiment, an amount of time rollback ($TIME_{ROLLBACK}$) provided by the debug unit is related to a size of the memory array and a rate in which trace data received by memory array. In one exemplary embodiment $$TIME_{ROLLBACK} = SIZE_{ARRAY}/(SIZE_{SAMPLE} \times F_{SAMPLE})$$

in which $SIZE_{ARRAY}$ comprises the size of the memory array, $SIZE_{SAMPLE}$ comprises a size of a sample of the trace data, and $F_{SAMPLE}$ comprises a sampling frequency of the trace data.

In one exemplary embodiment, in the first mode of operation, the trace data is sampled at a first sampling frequency, and in the second mode of operation, the trace data is sampled at a second sampling frequency in which the second sampling frequency is different from the first sampling frequency.

In one exemplary embodiment, the core processing unit comprises a microprocessor, a digital signal processor, a memory controller, a volatile memory, a non-volatile memory, a system controller, a peripheral bridge, a flash-memory programmer, application-specific logic, or a peripheral communication port driver. In one exemplary embodiment, the SOC is part of an electronic system that comprises a touch-screen display.

One exemplary embodiment provides a system to record trace data from at least one core processing unit of a plurality of core processing units of a system on a chip (SOC) that comprises and interface and a storage array. In one exemplary embodiment, the interface is configured to receive trace data from at least one core processing unit, and in which the interface is configurable to sample the received trace data at a selectable sampling frequency $F_{SAMPLE}$. In one exemplary embodiment, the storage array is configured to receive the trace data from the interface in a first mode of operation and in a second mode of operation. The first mode of operation occurs prior to an occurrence of a predetermined operating state of the SOC, and the second mode of operation occurs after the occurrence of the predetermined operating state of the SOC. In the first mode of operation, the storage array is configured to operate in a circular buffer mode in which a newest trace data overwrites an oldest trace data when the storage array becomes full. In the second mode of operation, the storage array is configured to operate in a first in, first out (FIFO) mode in which the newest trace data is written into the storage array and the oldest trace data contained in the storage array is output to a debug processing unit of the SOC. In one exemplary embodiment, the predetermined operating state occurs at a core processing unit from which the interface is not configured to receive trace data.

In one exemplary embodiment, the system further comprises an event detector configured to detect a predetermined operating state of the SOC.

In one exemplary embodiment, the interface is further configured to receive trace clock data from the corresponding core processing unit, and the memory array is further configured to receive the trace clock data. In the first mode of operation, the storage array is further configured to operate in the circular buffer mode in which the newest trace data and a newest trace clock data overwrites the oldest trace data and an oldest trace clock data contained in the storage array when the storage array becomes full. In the second mode of operation, the storage array is further configured to operate in the FIFO mode in which the newest trace data and the newest trace clock data is written into the storage array and the oldest trace data and the oldest trace clock data contained in the storage array is output to the debug processing unit of the SOC.

In one exemplary embodiment, an amount of time rollback ($TIME_{ROLLBACK}$) is related to a size of the memory array and a rate in which trace data received by memory array. In one exemplary embodiment, $$TIME_{ROLLBACK} = SIZE_{ARRAY}/(SIZE_{SAMPLE} \times F_{SAMPLE})$$

in which $SIZE_{ARRAY}$ comprises the size of the memory array, $SIZE_{SAMPLE}$ comprises a size of a sample of the trace data, and $F_{SAMPLE}$ comprises the sampling frequency of the trace data.

In one exemplary embodiment, in the first mode of operation, the trace data is sampled at a first sampling frequency, and in the second mode of operation, the trace data is sampled at a second sampling frequency in which the second sampling frequency is different from the first sampling frequency.

In one exemplary embodiment, the core processing unit comprises a microprocessor, a digital signal processor, a memory controller, a volatile memory, a non-volatile memory, a system controller, a peripheral bridge, a flash-memory programmer, application-specific logic, or a peripheral communication port driver. In one exemplary embodiment, the SOC is part of an electronic system that comprises a touch-screen display.

One exemplary embodiment provides a method to record trace data from at least one core processing unit of a plurality of core processing units of a system on a chip (SOC). The method comprises receiving trace data from the at least one core processing unit; detecting a predetermined operating state of the core processing unit; and storing the trace data in a storage array in a first mode of operation prior to detecting a predetermined operating state of the core processing unit and storing the trace data in the storage array in a second mode of operation after detecting the predetermined operating state of the core processing unit. In the first mode of operation, the storage array is configured to operate in a circular buffer mode in which a newest trace data overwrites an oldest trace data when the storage array becomes full. In the second mode of operation, the storage array is configured to operate in a first in, first out (FIFO) mode in which the newest trace data is written into the storage array and the oldest trace data contained in the storage array is output to a debug processing unit of the SOC. In one exemplary embodiment, the predetermined operating state occurs at a core processing unit from which the interface is not configured to receive trace data.

In one exemplary embodiment, receiving trace data further comprises receiving trace clock data from the corresponding core processing unit, and storing the trace data in the storage array further comprises storing the trace data and the trace clock data in the storage array in the first mode of operation prior to detecting the predetermined operating state of the core processing unit and in the second mode of operation after detecting the predetermined operating state of the core processing unit. In the first mode of operation, the storage array is further configured to operate in the circular buffer mode in which the newest trace data and a newest trace clock data overwrites the oldest trace data and an oldest trace clock data when the storage array becomes full. In the second mode of operation, the storage array is further configured to operate in the FIFO mode in which the newest trace data and the newest trace clock data is written into the storage array and the oldest trace data and the oldest trace clock data contained in the storage array is output to the debug processing unit of the SOC.

In one exemplary embodiment, an amount of time rollback ($TIME_{ROLLBACK}$) is related to a size of the memory array and a rate in which trace data received by memory array. In one exemplary embodiment, $$TIME_{ROLLBACK} = SIZE_{ARRAY}/(SIZE_{SAMPLE} \times F_{SAMPLE})$$

in which $SIZE_{ARRAY}$ comprises the size of the memory array, $SIZE_{SAMPLE}$ comprises a size of a sample of the trace data, and $F_{SAMPLE}$ comprises a sampling frequency of the trace data.

In one exemplary embodiment, in the first mode of operation, the trace data is sampled at a first sampling frequency, and in the second mode of operation, the trace data is sampled at a second sampling frequency in which the second sampling frequency is different from the first sampling frequency.

In one exemplary embodiment, at least one core processing unit comprises a microprocessor, a digital signal processor, a memory controller, a volatile memory, a non-volatile memory, a system controller, a peripheral bridge, a flash-memory programmer, application-specific logic, or a peripheral communication port driver, and the SOC is part of an electronic system that comprises a touch-screen display.

BRIEF DESCRIPTION OF THE DRAWINGS

Example embodiments will be more clearly understood from the following detailed description taken in conjunction with the accompanying drawings. The Figures represent non-limiting, example embodiments as described herein.

FIG. 4 depicts an exemplary arrangement of system components of a System on a Chip (SOC) that comprises a Design for Debug (DFD) architecture for an SOC according to the subject matter disclosed herein;

DESCRIPTION OF EMBODIMENTS

Figure 1:
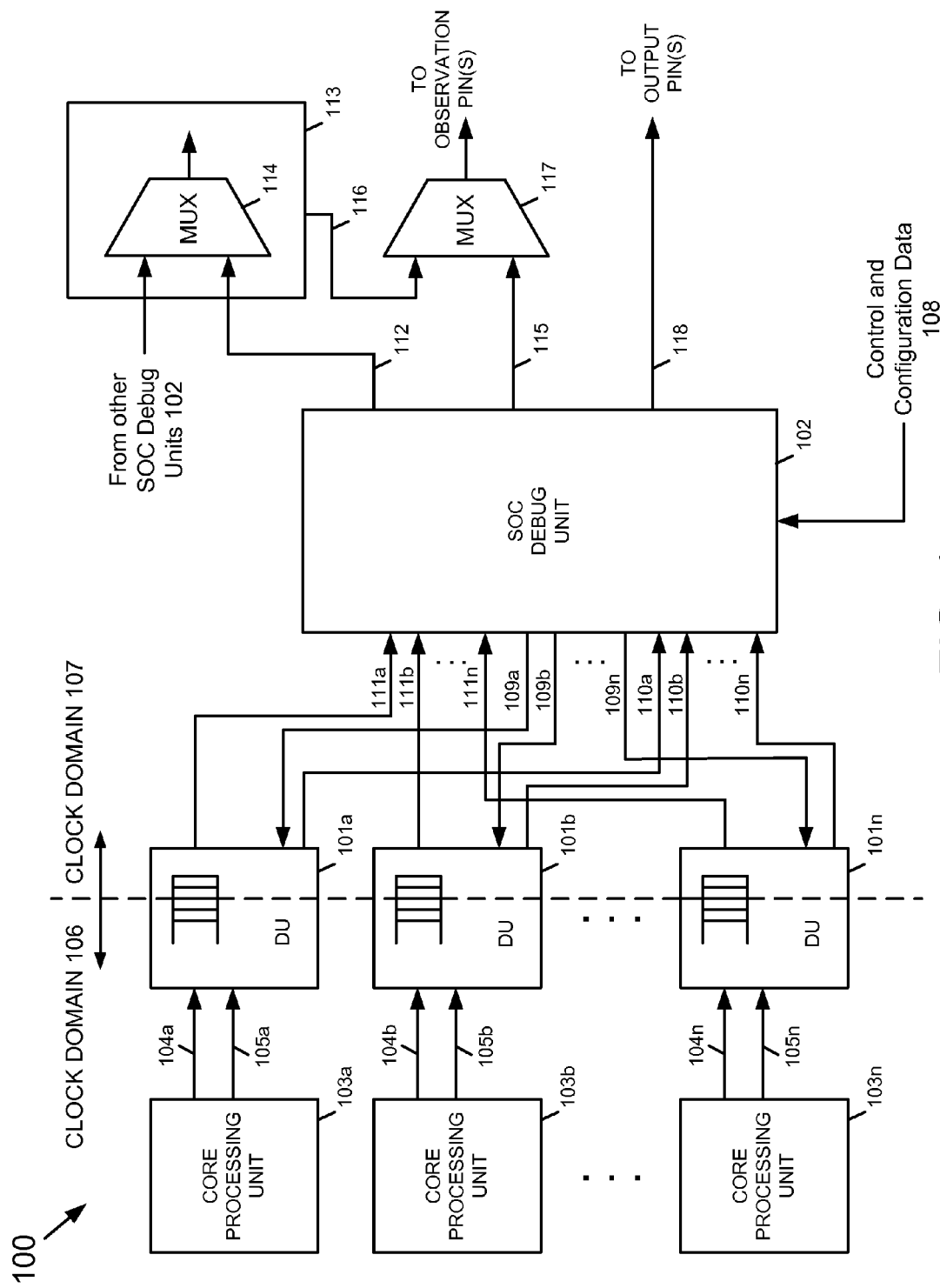
FIG. 1 depicts a functional block diagram of an exemplary embodiment of a Design for Debug (DFD) architecture for a System on a Chip (SOC) according to the subject matter disclosed herein.

The subject matter disclosed herein relates to debugging peripheral circuits within a System on a Chip (SOC). Exemplary embodiments provide a system and a method that captures speculative and concurrent trace-data and trace-clock information from core processing units of SOC. An interface receives trace data from at least one core processing unit, and a storage array stores the trace data in both of two different modes of operation. In the first mode, which occurs prior to a predetermined operating state of the SOC, the storage array operates in a circular buffer mode in which the newest trace data overwrites the oldest trace data when the storage array becomes full In the second mode, which occurs after the predetermined operating state of the SOC, the storage array operates in a FIFO mode in which the newest trace data is written into the storage array and the oldest trace data contained in the storage array is output to a debug processing core unit of the SOC.

Various exemplary embodiments will be described more fully hereinafter with reference to the accompanying drawings, in which some exemplary embodiments are shown. As used herein, the word "exemplary" means "serving as an example, instance, or illustration." Any embodiment described herein as "exemplary" is not to be construed as necessarily preferred or advantageous over other embodiments. The subject matter disclosed herein may, however, be embodied in many different forms and should not be construed as limited to the exemplary embodiments set forth herein. Rather, the exemplary embodiments are provided so that this description will be thorough and complete, and will fully convey the scope of the claimed subject matter to those skilled in the art. In the drawings, the sizes and relative sizes of layers and regions may be exaggerated for clarity.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Terms such as, but not limited to, "parallel," "perpendicular," "orthogonal," "equal," "regular," "aligned," "flat" and "coplanar" should respectively be understood as "parallel or substantially parallel," "perpendicular or substantially perpendicular," "orthogonal or substantially orthogonal," "equal or substantially equal," "regular or substantially regular," "aligned or substantially aligned," "flat or substantially flat" and "coplanar or substantially coplanar." Therefore, the embodiments disclosed herein are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the claimed subject matter.

The exemplary embodiments will be described with reference to cross-sectional views and/or plan views, which are ideal exemplary views. Thicknesses of layers and areas are exaggerated for effective description of the technical contents in the drawings. Forms of the embodiments may be modified by manufacturing technology and/or tolerance. Therefore, the embodiments are not intended to be limited to illustrated specific forms, and include modifications of forms generated according to manufacturing processes. For example, an etching area illustrated at a right angle may be round or have a predetermined curvature. Therefore, areas illustrated in the drawings have overview properties, and shapes of the areas are illustrated special forms of the areas of a device, and are not intended to be limited.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, like reference numerals in the drawings denote like elements. Therefore, although like reference numerals or similar reference numerals are not mentioned or described in the drawing, it will be described with reference to the other drawings. Further, although reference numerals are not illustrated, it will be described with reference to the other drawings.

In the following description of exemplary embodiments, reference is made to the accompanying drawings that form a part hereof, and that show by way of illustration specific embodiments in which the claimed subject matter may be practiced. These exemplary embodiments are described in sufficient detail to enable those skilled in the art to practice the claimed subject matter, and it is to be understood that other embodiments may be utilized and that changes may be made without departing from the scope of the claimed subject matter. The following detailed description is, therefore, not to be taken in a limiting sense, and the scope of the claimed subject matter is defined only by the appended claims.

Conventional SOC debug techniques usually involve iteratively working through probable sources of an observed failure in order to identify the root cause of the failure, which can be time consuming and unreliable, particularly if occurrences of a failure happen after long periods of time (i.e., days), is intermittent, and/or is not easily reproducible. Moreover, efforts to provide Design for Debug (DFD) capability by conventional debug architectures impose infrastructure requirements, such as timing and signal routing, that are similar in complexity to the infrastructure of the functional logic being monitored. Thus, a DFD capability provided by a conventional infrastructure can significantly complicate an SOC implementation, thereby adding to the cost and Time to Market (TTM) of an SOC-based product. In contrast, the subject matter disclosed herein provides a low-overhead DFD architecture that utilizes speculative, concurrent and distributed data capture, and trace-data propagation techniques for determining root-causing failures in an SOC while providing a simplified timing and signal routing arrangement.

FIG. 1 depicts a functional block diagram of an exemplary embodiment of a Design for Debug (DFD) architecture 100 for an SOC according to the subject matter disclosed herein. DFD architecture 100 comprises one or more debug units (DUs) 101a-101n and one or more SOC debug units 102, of which only one SOC debug unit 102 is shown. Each DU 101 is coupled in a well-known manner to a core processing unit 103 through one or more trace-data lines 104 and/or one or more trace-clock lines 105. A core processing unit 103 could comprise, but is not limited to, a microprocessor, a digital signal processor, a memory controller, a volatile memory, a non-volatile memory, a system controller, a peripheral bridge, a flash-memory programmer, application-specific logic, or a peripheral communication port driver. As depicted in FIG. 1, architecture 100 spans two clock domains—a first clock domain 106 that corresponds to the clock domain of core processing units 103 and a second clock domain that corresponds to SOC debug unit 102. It should be understood, however, that clock domain 106, which is depicted as corresponding to the clock domain of core processing units 103 may actually comprise a separate clock domain for each respective core processing unit 103.

SOC debug unit 102 receives control and configuration data 108 from a configuration controller (not shown). Control and configuration data 108 comprises, but is not limited to, information related to configuring DUs 101a-101n and information related to specific trigger events for triggering the one or more DUs 101a-101n. SOC debug unit 102 respectively outputs control and configuration data 109a-109n to DUs 101a-101n. DUs 101a-101n respectively output event-control and configuration data 110a-110n to SOC debug unit 102. In one exemplary embodiment event-control and configuration data 110 output by a DU may relate to status and state information of the DU. When triggered, DUs 101a-101n respectively output trace-data and trace-clock information 111a-111b to SOC debug unit 102.

In one exemplary embodiment, one or more outputs 112 from one or more SOC debug units 102 are coupled to a higher-level debug system 113, such as, but not limited to, a CoreSight™ debug and trace system, through a multiplexer 114. In one exemplary embodiment, higher-level debug system 113 may be in a clock domain that is separate from clock domain 107. In one exemplary embodiment, one or more outputs 115 from SOC debug unit 102 and one or more outputs 116 from the higher-level debug system 113 are coupled through, for example, a multiplexer 117 to, for example, one or more observation pins (not shown) of the SOC. In another exemplary embodiment, one or more outputs 118 from SOC debug unit 102 are coupled to one or more output pins (not shown) of SOC without being multiplexed with outputs from the higher-level debug system 113.

Figure 2:
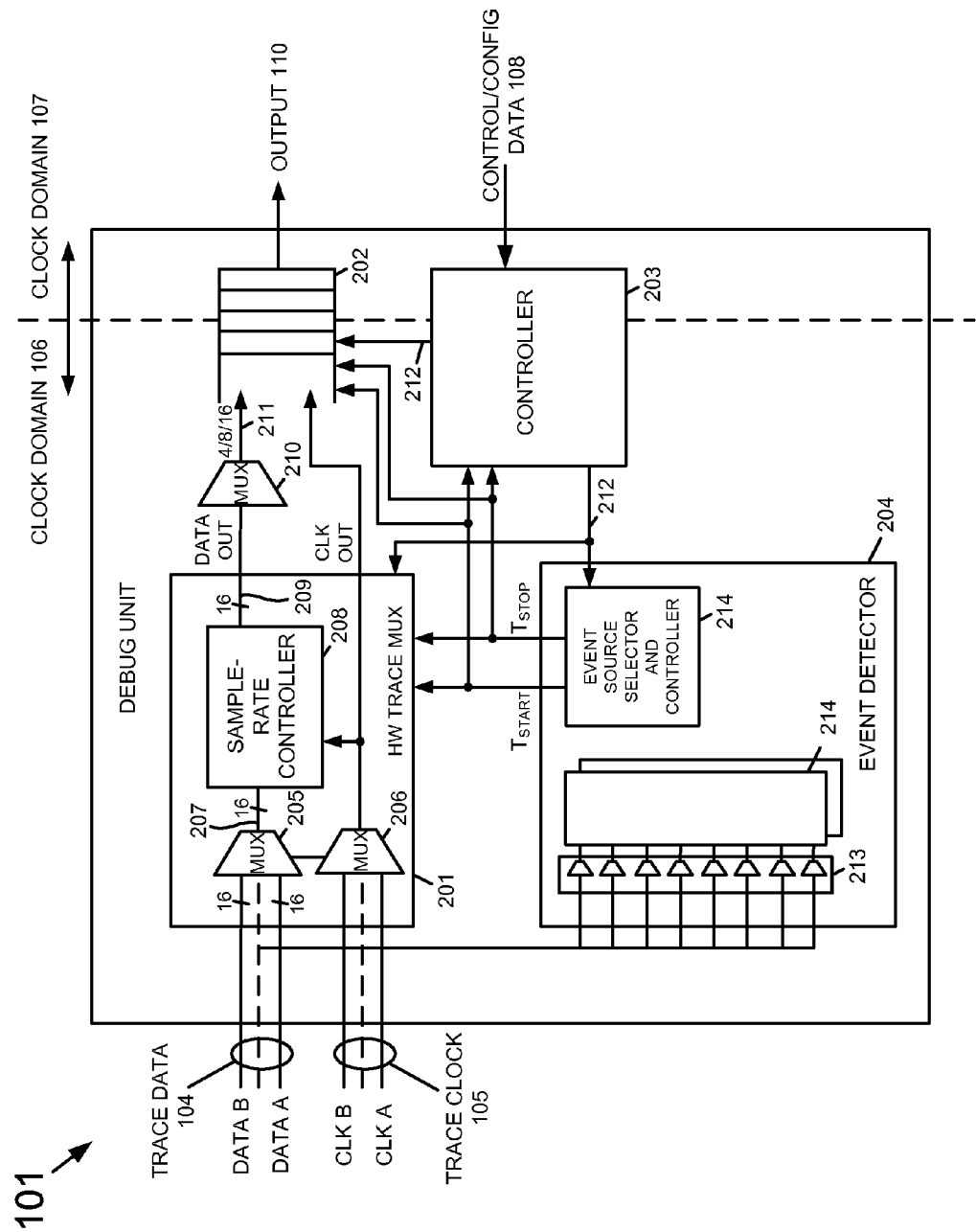
FIG. 2 depicts a functional block diagram of an exemplary embodiment of a Debug Unit (DU) according to the subject matter disclosed herein.

FIG. 2 depicts a functional block diagram of an exemplary embodiment of a Debug Unit (DU) 101 according to the subject matter disclosed herein. A DU 101 comprises a hardware trace multiplexer 201, a memory array 202, a controller 203, and an event detector 204. The hardware trace multiplexer 201 comprises a trace-data multiplexer 205, a trace-clock multiplexer 206 and a sample-rate controller 207. As depicted in FIG. 2, trace-data multiplexer 205 is coupled to one or more trace-data signal lines 104 that are output from a corresponding core processing unit 103 (not shown in FIG. 2). Trace-clock multiplexer 206 is coupled to one or more trace-clock signal lines 105 that are output from the corresponding core processing unit 103.

In one exemplary embodiment, trace-data signal lines 104 comprise one or more DATA A signal lines and one or more DATA B signal lines. In one exemplary embodiment, the DATA A signal lines comprise 16 signals lines, and the DATA B signal lines comprise 16 signal lines. In one exemplary embodiment, trace-clock signal lines 105 comprise a trace-clock A (CLK A) signal line and a trace-clock B (CLK B) signal line. Multiplexers 205 and 206 allow controlled selection of trace DATA A or trace DATA B signal lines, and controlled selection of trace CLK A or trace CLK B signal lines. In another exemplary embodiment in which one set of the trace-data signal lines and/or one of the trace-clock signal lines are not present, the corresponding multiplexer(s) 205 and/or 206 may be omitted.

The output 207 of trace data multiplexor 205 is coupled to an input of a sample-rate controller 208. Sample rate controller 208 can be used to select the rate at which trace-data is output to memory array 202 based on a selected trace-clock signal. In one exemplary embodiment, sample-rate controller 208 can be configured to output a reduced number of samples by dividing the input stream by, for example, a binary number. The output 209 of sample-rate controller 208 is coupled through a multiplexer 210 to memory array 202 at 211.

In one exemplary embodiment, multiplexer 210 controllably selects the size of the samples ($SIZE_{SAMPLE}$) of the trace-data data stream that is input to memory array 202. For example, if 16 lines of DATA A are to be captured in memory array 202, then multiplexer 211 is configured to output the 16 signal lines output from hardware trace multiplexer 201. If, for example, 16 lines of DATA B are to be captured in memory array 202, then multiplexer 211 is configured to output the 16 lines of DATA B that are output from hardware trace multiplexer 201. If, for example, eight lines of DATA A and eight lines of DATA B are to be captured, then multiplexer 205 (in hardware trace multiplexer 201) is configured to output the selected eight lines of DATA A and the selected eight lines of DATA B, and multiplexer 211 is configured to pass the 16 selected lines that are output from hardware multiplexer 201. In one exemplary embodiment, multiplexer 205 can be configured to select any or all of the trace-data lines coupled to the input of multiplexer 205. Although multiplexer 205 is depicted as comprising a 32-line input and a 16-line output, it should be understood that multiplexer 205 is not so limited and can have any number of input lines and output lines. Multiplexer 206 can be configured to select either CLK A or CLK B for output to memory array 202. Additionally, although multiplexer 206 is depicted as comprising a 2-line input and a 1-line output, it should be understood that multiplexer 206 is not so limited and can have any number of input lines and output lines.

A DU 102 comprises two modes of operations, a pre-trigger mode and a triggered mode. Memory array 202 can be configured in a first mode of operation (i.e., a pre-triggered mode) to operate as a circular buffer in which the newest trace data overwrites the oldest trace data when the memory array 202 becomes full. In a second mode of operation (i.e., a triggered mode), memory array 202 configured to operate as a first in, first out (FIFO) buffer in which the newest trace data is written into the storage array and the oldest trace data contained in the memory array 202 is output to, for example, an SOC debug processing unit 102 of the SOC 101. In one exemplary embodiment, memory array 202 is configured to have a plurality of memory cells that are arranged in rows and columns In one exemplary embodiment, memory array 202 is configured in the pre-triggered mode to receive trace data in a parallel manner and to load all of the memory cells of the array in a shift-register manner to completely utilize all of memory array 202 before overwriting the oldest trace data. That is, if a row of memory cells in memory array 202 comprises 128 memory cells and a data stream is input to memory array 202 that comprises trace-data units that is 16-bits wide, eight 16-bit wide trace-data units will be stored in a row before trace-data units are stored in the next row. If, for example, a row of memory cells in memory array 202 comprises 64 memory cells and a data stream in input to memory array 202 that comprises trace-data units that are 14-bits wide and trace-clock units that are 2-bits wide, four groups of the 14-bit trace-data units plus the 2-bit trace-clock units will be stored in a row before the trace-data units and the trace-clock units are stored in the next row. In one exemplary embodiment, the trace data stored in memory array 202 can also comprise time-stamp information along with the trace information.

DU 102 is initialized and configured by control and configuration data 109 to select trace data and clock information that is desired to be captured at a given sampling rate $F_{SAMPLE}$. The selected sampling rate $F_{SAMPLE}$ is typically the clock frequency of the core processing unit 103 that is coupled to the DU. Additionally, control and configuration data 109 comprises information for identifying one or more trigger conditions that causes event detector 204 to output a trace start signal $T_{START}$ indicating that a "condition of interest" has occurred.

Controller 203 receives control and configuration data 109 from a SOC debug unit 102. Control and configuration data 109 comprises, but is not limited to, information related to configuring DU 101, such as whether trace DATA A and/or trace DATA B, and whether trace CLK A or trace CLK B is selected, a sample rate $F_{SAMPLE}$, and specific trigger events. Controller 203 outputs control and configuration data information 212 to hardware trace multiplexer 201, memory array 202 and event detector 204.

Event detector 204 comprises a plurality of event multiplexers 213 that are coupled to the trace-data signal lines 104 and the trace-clock signal lines 105. Event detector 204 also comprises an event source selector and controller 214 and an event detector logic 215. Event source selector and controller 214 receives control and configuration information 212 from controller 203. Event multiplexers 213 are selectively controlled by the control and configuration information 212 to select particular trace-data lines 104 and particular trace-clock lines 105 that are coupled to event detector logic 215 in order to detect one or more desired event conditions ("conditions of interest") that trigger memory array 202 to transition from the pre-triggered mode to the triggered mode.

While waiting for the trace start signal $T_{START}$ to occur, memory array 202 operates in the pre-triggered mode, and trace data and trace clock information output from the core processing unit 103 is continually captured in memory array 202. That is, the trace data and trace clock information is captured speculatively in anticipation of the trace start signal $T_{START}$. In one exemplary embodiment, a "condition of interest" signal that corresponds to $T_{START}$ may be received by controller 203 that is generated by another DU or elsewhere in the SOC as a control and configuration data signal 108. Such a situation may occur when a "condition of interest" is detected at another core processing unit 103 that is being monitored by another DU 101, in which case the "condition of interest" signal detected elsewhere causes a local controller 203 to reconfigure a local memory array 202 to operate in the triggered mode.

The size ($SIZE_{ARRAY}$) of memory array 202 provides an upper bound to the number of trace data and trace clock samples that can be stored at any given point in time. In one exemplary embodiment, the sample rate of the trace data and trace clock can be varied by, for example, sample-rate controller 208, thereby varying the amount of "time rollback" provided by memory array 202 during the pre-triggered mode.

On receiving the trace start signal $T_{START}$, memory array 202 reconfigures and operates in the triggered mode by switching into a first in, first out (FIFO) mode of operation. That is, the newest samples are written into memory array 202 while the oldest samples are output from memory array 202 and propagated to downstream components, such as SOC Debug Unit 102 for storage and processing. In one exemplary embodiment, the sample rate remains the same after occurrence of the trace start signal $T_{START}$. In another exemplary embodiment, the sample rate can be varied by sample-rate controller after the occurrence of the trace start signal $T_{START}$. In one exemplary embodiment, a trace stop $T_{STOP}$ signal can be used to control the amount of data that is captured after the trace start signal $T_{START}$ occurs.

According to the subject matter disclosed herein, the pre-triggered mode allows time to be "rolled back" to observe the state of the core processing unit 103 prior to the trace start signal $T_{START}$. The amount of the time "roll back" ($TIME_{ROLLBACK}$) is related to the size ($SIZE_{ARRAY}$) of a memory array, the size ($SIZE_{SAMPLE}$) of a sample of the trace data, and the rate ($F_{SAMPLE}$) in which data is clocked into the memory array. That is, $$TIME_{ROLLBACK} = SIZE_{ARRAY}/(SIZE_{SAMPLE} \times F_{SAMPLE}).$$

In one exemplary embodiment, the rollback period ($TIME_{ROLLBACK}$) can be independently set and controlled for each core processing unit 103 that is to be monitored. In one exemplary embodiment, the event trigger can be used to set a marker within the captured data stream to establish a temporal relationship between the captured data samples and the trigger condition $T_{START}$.

Figure 3:
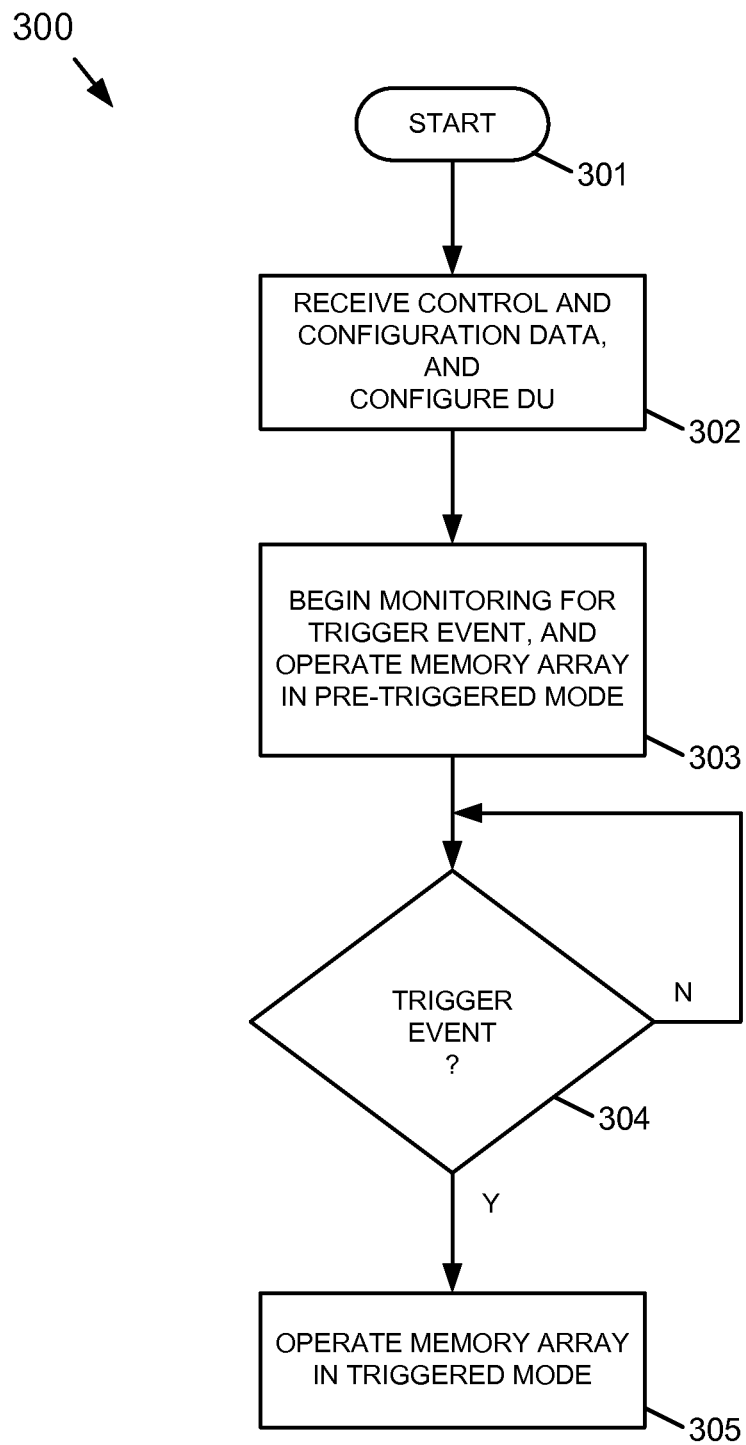
FIG. 3 depicts a flow diagram of an exemplary embodiment of a process for capturing speculative and concurrent trace-data and trace-clock information output from a core processing unit according to the subject matter disclosed herein.

FIG. 3 depicts a flow diagram of an exemplary embodiment of a process 300 for capturing speculative and concurrent trace-data and trace-clock information output from a core processing unit according to the subject matter disclosed herein. Process 300 starts at 301 in FIG. 3. At 302, control and configuration data is received at a DU from an SOC debug unit. In one exemplary embodiment, the control and configuration data comprises, but is not limited to, information related to whether trace DATA A and/or trace DATA B, and whether trace CLK A or trace CLK B is/are selected, a sample rate $F_{SAMPLE}$, and one or more specific trigger events. At 303, monitoring for the one or more specific trigger events begins, and the memory array of the DU is configured to operate in a pre-trigger mode. That is, the memory array operates as a circular buffer in which the newest trace data overwrites the oldest trace data when the memory array becomes full. At 304, it is determined whether a trigger event has occurred.

If, at 304, it is determined that no trigger event has occurred, flow returns to 304. If it is determined that a trigger event has occurred, flow continues to 305 where the memory array operates in the triggered mode. That is, the memory array is configured to operate as a first in, first out (FIFO) buffer in which the newest trace data is written into the storage array and the oldest trace data contained in the memory array is output to the SOC debug processing unit for further processing and analysis. In one exemplary embodiment, a determination that a trigger event has occurred may be because a "condition of interest" has been detected by another DU in the SOC. That is, such a situation may occur when a "condition of interest" is detected at another core processing unit 103 that is being monitored by another DU, in which case flow continues to 305 where the memory array operates in the triggered mode.

Figure 4:
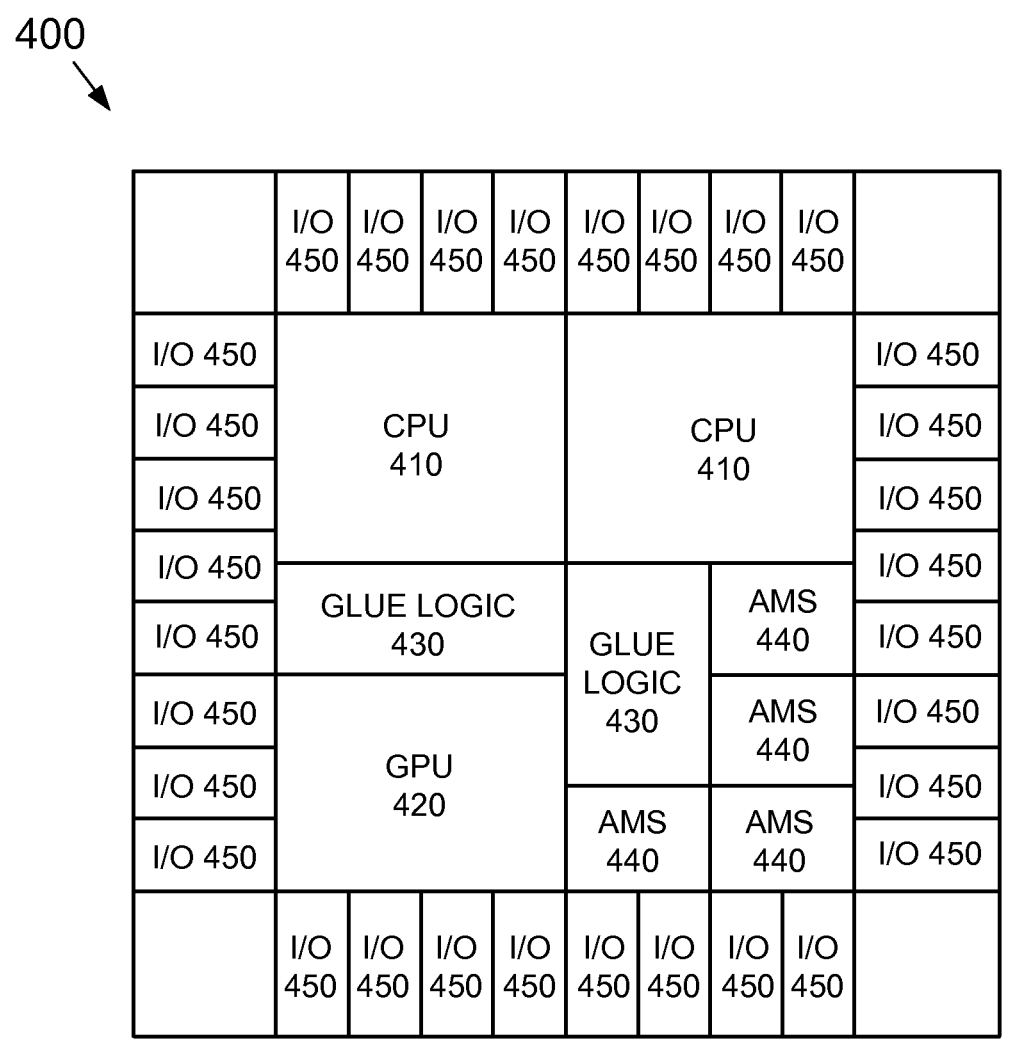

FIG. 4 depicts an exemplary arrangement of system components of a System on a Chip (SOC) 400 that comprises a Design for Debug (DFD) architecture for an SOC according to the subject matter disclosed herein. The exemplary arrangement of SOC 400 comprises one or more central processing units (CPUs) 410, one or more graphical processing units (GPUs) 420, one or more areas of glue logic 430, one or more analog/mixed signal (AMS) areas 440, and one or more Input/Output (I/O) areas 450. A DFD architecture for an SOC may be part of glue logic 430 and may be coupled to core processing units, such as, but not limited to, CPUs 410, GPU 420, portions of glue logic 430, AMS areas 440 and I/O areas 450. It should be understood that other arrangements of SOC 400 are possible and that SOC 400 could comprise other system components than those depicted in FIG. 4. SOC 400, which may comprise a DFD architecture according to the subject matter disclosed herein, may be used in various types of electronic devices, such as, but not limited to, a computing device, a personal digital assistant (PDA), a laptop computer, a mobile computer, a web tablet, a wireless phone, a cell phone, a smart phone, a digital music player, or a wireline or wireless electronic device.

Figure 5:
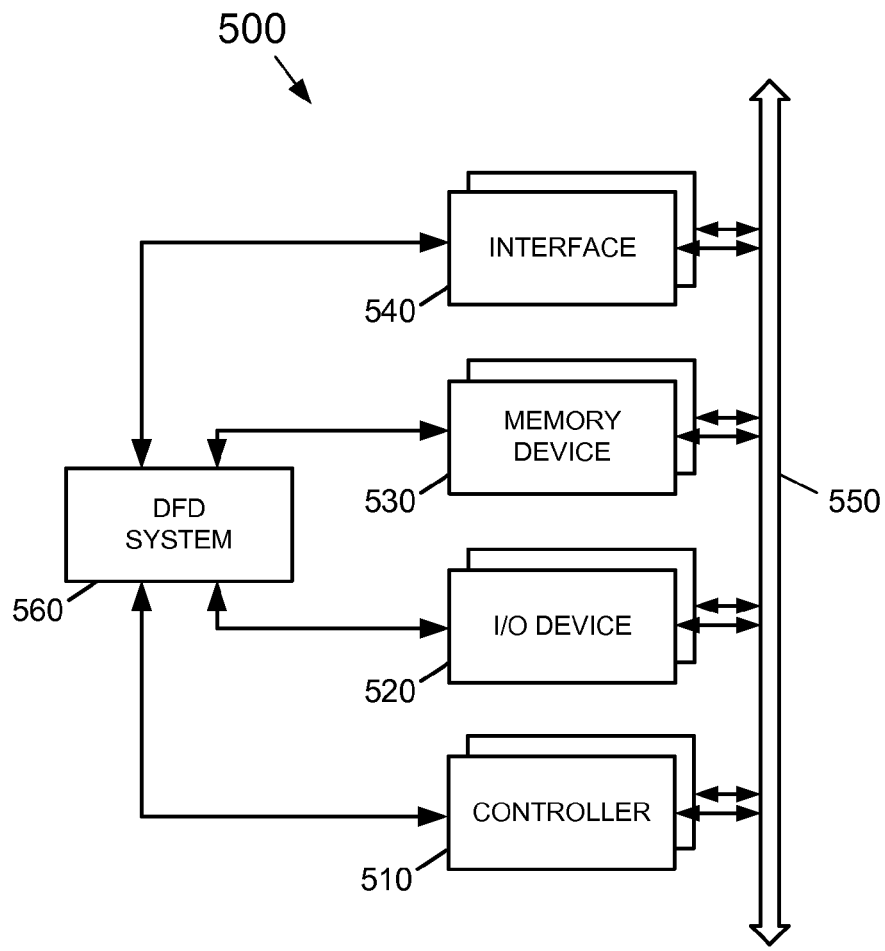
FIG. 5 depicts a functional block diagram of an exemplary embodiment of an electronic device that comprises a DFD system according to the subject matter disclosed herein.

FIG. 5 depicts a functional block diagram of an exemplary embodiment of an electronic device 500 that comprises a DFD system according to the subject matter disclosed herein. Electronic device 500 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 500 may comprise an SOC that comprises one or more core processing units 510, such as a controller; one or more input/output controller devices 520, such as, but not limited to, a keypad controller, a keyboard controller, a graphics processing unit (GPU), a display controller, or a touch-screen display controller; one or more memory devices 530, and one or more wireless interfaces 540 that are coupled to each other through a bus 550. In one exemplary embodiment, the block representing an input/output controller device 520 also represents and comprises a display or a touch-screen display. The various components forming electronic system 500 may be coupled together via one or more buses 550. A DFD system 560 may be coupled to the various components forming electronic device 500 to capture speculative and concurrent trace-data and trace-clock information output from a core processing unit for processing and analysis according to the subject matter disclosed herein.

In one exemplary embodiment, the controller 510 may comprise, for example, at least one microprocessor, at least one digital signal process, at least one microcontroller, or the like. A memory device 530 may be configured to store a command code to be used by the controller 510 or a user data. The electronic device 500 may use one or more wireless interfaces 540 configured to transmit data to or receive data from a wireless communication network using a RF signal. The wireless interfaces 540 may include, for example, an antenna, a wireless transceiver and so on. The electronic system 500 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Figure 6:
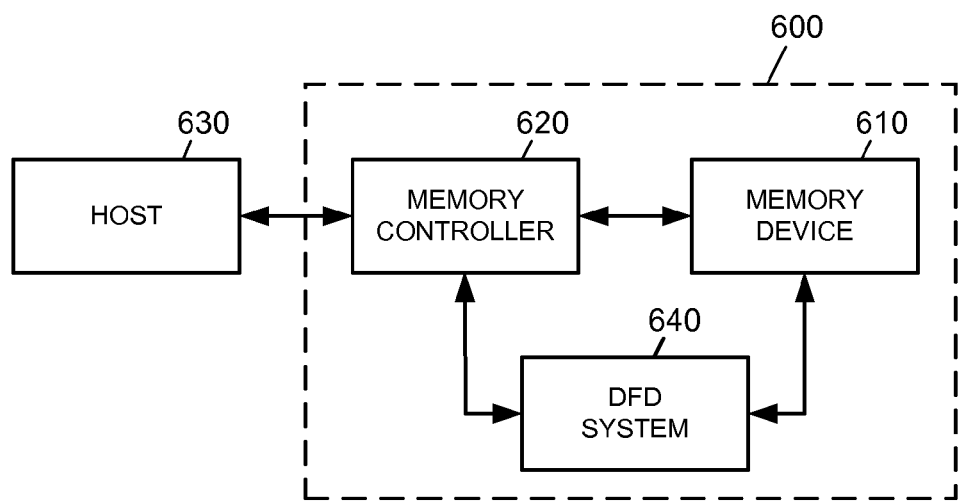
FIG. 6 depicts a memory system that may comprise a DFD system according to the subject matter disclosed herein.

FIG. 6 depicts a memory system 600 that may comprise a DFD system according to the subject matter disclosed herein. The memory system 600 may comprise an SOC that comprises a memory device 610 for storing large amounts of data and a memory controller 620. The memory controller 620 controls the memory device 610 to read data stored in the memory device 610 or to write data into the memory device 610 in response to a read/write request of a host 630. The memory controller 630 may include an address-mapping table for mapping an address provided from the host 630 (e.g., a mobile device or a computer system) into a physical address of the memory device 610. A DFD system 640 may be coupled to the various components forming memory system 600.

The various components forming memory system 600 may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique. The package in which the semiconductor memory device according to one of the above exemplary embodiments is mounted may further include at least one semiconductor device (e.g., a controller and/or a logic device) that controls the semiconductor memory device.

The foregoing has outlined, in general, various aspects of exemplary embodiments and is to serve as an aid to better understanding the more complete detailed description which is to follow. In reference to such, there is to be a clear understanding that the subject matter disclosed herein is not limited to the methods, apparatus, systems and/or applications of use described and illustrated herein. It is intended that any other advantages and objects of the disclosed subject matter that become apparent or obvious from the detailed description or illustrations contained herein are within the scope of the appended claims.

What is claimed is:

1. A system on a chip (SOC), comprising:
   at least one core processing unit; and
   a debug unit corresponding to at least core processing unit, the at least one debug unit comprising:
      an interface configured to receive trace data from the corresponding core processing unit;
      an event detector configured to detect a predetermined operating state of the core processing unit; and
      a storage array configured to receive the trace data from the interface in a first mode of operation and in a second mode of operation,
      the first mode of operation occurring prior to the event detector detecting the predetermined operating state, and in the first mode of operation, the storage array being configured to operate in a circular buffer mode in which a newest trace data overwrites an oldest trace data contained in the storage array when the storage array becomes full, and
      the second mode of operation occurring after the event detector detects the predetermined operating state, and in the second mode of operation, the storage array being configured to operate in a first in, first out (FIFO) mode in which the newest trace data is written into the storage array and the oldest trace data contained in the storage array is output to a debug processing unit of the SOC.

2. The SOC according to claim 1, wherein the interface is further configured to receive trace clock data from the corresponding core processing unit,
   wherein the memory array is further configured to receive the trace clock data,
   wherein in the first mode of operation, the storage array being further configured to operate in the circular buffer mode in which the newest trace data and a newest trace clock data overwrites the oldest trace data and an oldest trace clock data contained in the storage array when the storage array becomes full, and
   wherein in the second mode of operation, the storage array being further configured to operate in the FIFO mode in which the newest trace data and the newest trace clock data is written into the storage array and the oldest trace data and the oldest trace clock data contained in the storage array is output to the debug processing unit of the SOC.

3. The SOC according to claim 1, wherein an amount of time rollback ($TIME_{ROLLBACK}$) is related to a size of the memory array and a rate in which trace data received by memory array.

4. The system according to claim 3, wherein $$TIME_{ROLLBACK}=SIZE_{ARRAY}/(SIZE_{SAMPLE} \times F_{SAMPLE})$$

in which $SIZE_{ARRAY}$ comprises the size of the memory array, $SIZE_{SAMPLE}$ comprises a size of a sample of the trace data, and $F_{SAMPLE}$ comprises a sampling frequency of the trace data.

5. The SOC according to claim 3, wherein in the first mode of operation, the trace data is sampled at a first sampling frequency, and
   wherein in the second mode of operation, the trace data is sampled at a second sampling frequency, the second sampling frequency being different from the first sampling frequency.

6. The SOC according to claim 1, wherein the core processing unit comprises a microprocessor, a digital signal processor, a memory controller, a volatile memory, a non-volatile memory, a system controller, a peripheral bridge, a flash-memory programmer, application-specific logic, or a peripheral communication port driver.

7. The SOC according to claim 6, wherein the SOC is part of an electronic system that comprises a touch-screen display.

8. A system to record trace data from at least one core processing unit of a plurality of core processing units of a system on a chip (SOC), the system comprising:
   an interface configured to receive trace data from at least one core processing unit, the interface being configurable to sample the received trace data at a selectable sampling frequency $F_{SAMPLE}$; and
   a storage array configured to receive the trace data from the interface in a first mode of operation and in a second mode of operation,
   the first mode of operation occurring prior to an occurrence of a predetermined operating state of the SOC, and the storage array being configured in the first mode of operation to operate in a circular buffer mode in which a newest trace data overwrites an oldest trace data when the storage array becomes full, and
   the second mode of operation occurring after the occurrence of the predetermined operating state of the SOC, and the storage array being configured in the second mode of operation to operate in a first in, first out (FIFO) mode in which the newest trace data is written into the storage array and the oldest trace data contained in the storage array is output to a debug processing unit of the SOC.

9. The system according to claim 8, further comprising an event detector configured to detect a predetermined operating state of the SOC.

10. The system according to claim 8, wherein the interface is further configured to receive trace clock data from the corresponding core processing unit,
   wherein the memory array is further configured to receive the trace clock data,
   wherein in the first mode of operation, the storage array being further configured to operate in the circular buffer mode in which the newest trace data and a newest trace clock data overwrites the oldest trace data and an oldest trace clock data contained in the storage array when the storage array becomes full, and wherein in the second mode of operation, the storage array being further configured to operate in the FIFO mode in which the newest trace data and the newest trace clock data is written into the storage array and the oldest trace data and the oldest trace clock data contained in the storage array is output to the debug processing unit of the SOC.

11. The system according to claim 8, wherein an amount of time rollback ($TIME_{ROLLBACK}$) is related to a size of the memory array and a rate in which trace data received by memory array.

12. The system according to claim 11, wherein $$TIME_{ROLLBACK}=SIZE_{ARRAY}/(SIZE_{SAMPLE} \times F_{SAMPLE})$$

in which $SIZE_{ARRAY}$ comprises the size of the memory array, $SIZE_{SAMPLE}$ comprises a size of a sample of the trace data, and $F_{SAMPLE}$ comprises the sampling frequency of the trace data.

13. The system according to claim 10, wherein in the first mode of operation, the trace data is sampled at a first sampling frequency, and wherein in the second mode of operation, the trace data is sampled at a second sampling frequency, the second sampling frequency being different from the first sampling frequency.

14. The system according to claim 8, wherein the core processing unit comprises a microprocessor, a digital signal processor, a memory controller, a volatile memory, a non-volatile memory, a system controller, a peripheral bridge, a flash-memory programmer, application-specific logic, or a peripheral communication port driver, and wherein the SOC is part of an electronic system that comprises a touch-screen display.

15. A method to record trace data from at least one core processing unit of a plurality of core processing units of a system on a chip (SOC), the method comprising:

receiving trace data from the at least one core processing unit;

detecting a predetermined operating state of the core processing unit; and storing the trace data in a storage array in a first mode of operation prior to detecting a predetermined operating state of the core processing unit and in a second mode of operation after detecting the predetermined operating state of the core processing unit, in the first mode of operation the storage array being configured to operate in a circular buffer mode in which a newest trace data overwrites an oldest trace data when the storage array becomes full, and in the second mode of operation the storage array being configured to operate in a first in, first out (FIFO) mode in which the newest trace data is written into the storage array and the oldest trace data contained in the storage array is output to a debug processing unit of the SOC.

16. The method according to claim 15, wherein receiving trace data further comprises receiving trace clock data from the corresponding core processing unit, wherein storing the trace data in the storage array further comprises storing the trace data and the trace clock data in the storage array in the first mode of operation prior to detecting the predetermined operating state of the core processing unit and in the second mode of operation after detecting the predetermined operating state of the core processing unit, wherein in the first mode of operation, the storage array being further configured to operate in the circular buffer mode in which the newest trace data and a newest trace clock data overwrites the oldest trace data and an oldest trace clock data when the storage array becomes full, and wherein in the second mode of operation, the storage array being further configured to operate in the FIFO mode in which the newest trace data and the newest trace clock data is written into the storage array and the oldest trace data and the oldest trace clock data contained in the storage array is output to the debug processing unit of the SOC.

17. The method according to claim 15, wherein an amount of time rollback ($TIME_{ROLLBACK}$) is related to a size of the memory array and a rate in which trace data received by memory array.

18. The method according to claim 17, wherein $$TIME_{ROLLBACK}=SIZE_{ARRAY}/(SIZE_{SAMPLE} \times F_{SAMPLE})$$

in which $SIZE_{ARRAY}$ comprises the size of the memory array, $SIZE_{SAMPLE}$ comprises a size of a sample of the trace data, and $F_{SAMPLE}$ comprises a sampling frequency of the trace data.

19. The SOC according to claim 17, wherein in the first mode of operation, the trace data is sampled at a first sampling frequency, and wherein in the second mode of operation, the trace data is sampled at a second sampling frequency, the second sampling frequency being different from the first sampling frequency.

20. The method according to claim 15, wherein the at least one core processing unit comprises a microprocessor, a digital signal processor, a memory controller, a volatile memory, a non-volatile memory, a system controller, a peripheral bridge, a flash-memory programmer, application-specific logic, or a peripheral communication port driver, and wherein the SOC is part of an electronic system that comprises a touch-screen display.

\* \* \* \* \*